United States Patent [19]

Hoover

[11] Patent Number: 4,491,807
[45] Date of Patent: Jan. 1, 1985

[54] FET NEGATIVE RESISTANCE CIRCUITS
[75] Inventor: Merle V. Hoover, Flemington, N.J.
[73] Assignee: RCA Corporation, New York, N.Y.
[21] Appl. No.: 380,289
[22] Filed: May 20, 1982
[51] Int. Cl.³ .................. H03K 3/354; H03H 11/00
[52] U.S. Cl. ...................... 331/111; 331/115; 333/217
[58] Field of Search .............. 331/111, 108 A, 115; 333/213–216, 217

[56] References Cited

U.S. PATENT DOCUMENTS

| | | | |
|---|---|---|---|
| 3,843,933 | 10/1974 | Ahmed | 330/26 |
| 3,863,169 | 1/1975 | Knight | 330/22 |
| 3,887,884 | 6/1975 | Suzuki | 331/111 |
| 4,230,999 | 10/1980 | Ahmed | 331/115 |

FOREIGN PATENT DOCUMENTS 2556683  6/1976  Fed. Rep. of Germany ...... 333/217

OTHER PUBLICATIONS

The Synthesis of Integrable, Nearly Sinusoidal Potentially Bistable Oscillators, IEEE JSSC vol. scl, No. 2, Dec. 1966, pp. 111–117.
J. D. Lenk, Handbook for Transistors, Prentice Hall, Inc., Englewood Cliffs, N.J., 1976, pp. 178–185.

Primary Examiner—Siegfried H. Grimm
Attorney, Agent, or Firm—Joseph S. Tripoli; George E. Haas; Henry I. Schanzer

[57] ABSTRACT

FET circuitry is described which may be substituted for a programmable unijunction transistor particularly on CMOS-FET integrated circuits. The FET circuitry is arranged between first and second terminals defining a conduction path exhibiting a negative resistance characteristic and a control terminal for establishing the peak voltage of such characteristic. A P-type MOS transistor has its source and gate electrodes respectively connected to the first and control terminals. A current mirror amplifier comprising N-type MOS transistors has its input terminal connected to the drain electrode of the P-type transistor, its output terminal connected to the control terminal and its common terminal connected to the second terminal of the circuitry.

10 Claims, 3 Drawing Figures

FET NEGATIVE RESISTANCE CIRCUITS

BACKGROUND OF THE INVENTION

This invention relates to circuitry constructed from complementary field effect transistors which exhibit negative resistance characteristics. More particularly the invention is a Complementary Symmetry Metal-Oxide-Semiconductor Field-Effect Transistor (CMOS-FET) circuit substitute for a Programmable Unijunction Transistor (PUT).

Negative resistance devices have wide application as switching devices and are typically formed as discrete circuit elements and are conventionally charge controlled devices. Certain negative resistance circuit elements such as the PUT, however, may be formed as a composite of bipolar transistors. PUT's are commonly used as discrete circuit elements, but when required on an integrated circuit (IC) can be formed by interconnecting the collector and base electrodes of a pnp transistor respectively to the base and collector electrodes of an npn transistor. One of the collector-base interconnections serves as a control electrode for a principal conduction path between the emitter electrodes of the two transistors.

Bipolar IC's are classically manufactured on P-type semiconductor substrate material. IC's fabricated with technologies to provide CMOS-FET's (e.g., for digital-circuit applications) on the other hand are commonly manufactured on N-type substrate material and, in some instances, with Silicon-on-Sapphire (SOS) material. The use of these N-type and SOS substrate materials imposes severe limitations on the concomitant integration of complementary bipolar transistors suitable for producing PUT's on CMOS-FET IC's. Although operable lateral-type bipolar transistors can be fabricated on these substrate materials, they have characteristics which limit their usefulness, i.e., low forward current gain and relatively low gain-bandwidth product. Furthermore, lateral-type bipolar transistors fabricated on N-type substrate material with process-compatible CMOS-FET's are prone to spurious parasitic SCR-type latch-up. Additionally, the overdriven (saturated) operation of bipolar transistors connected in PUT configurations limits their operational speeds as a consequence of their inherent storage time.

SUMMARY OF THE INVENTION

The present invention relates to FET circuitry which may be substituted for programmable unijunction transistors particularly on CMOS-FET integrated circuits. The FET circuitry is arranged between first and second terminals defining a conduction path exhibiting a negative resistance characteristic and a control terminal for establishing the peak voltage of such characteristic. A P-type MOS transistor has its source and gate electrodes respectively connected to the first and control terminals. A current mirror amplifier comprising N-type MOS transistors has its input terminal connected to the drain electrode of the P-type transistor, its output terminal connected to the control terminal and its common terminal connected to the second terminal of the circuitry.

DETAILED DESCRIPTION OF THE INVENTION

The present invention will be described with reference to relaxation oscillator circuitry though it will be understood that it is not limited to this particular application.

Figure 1:
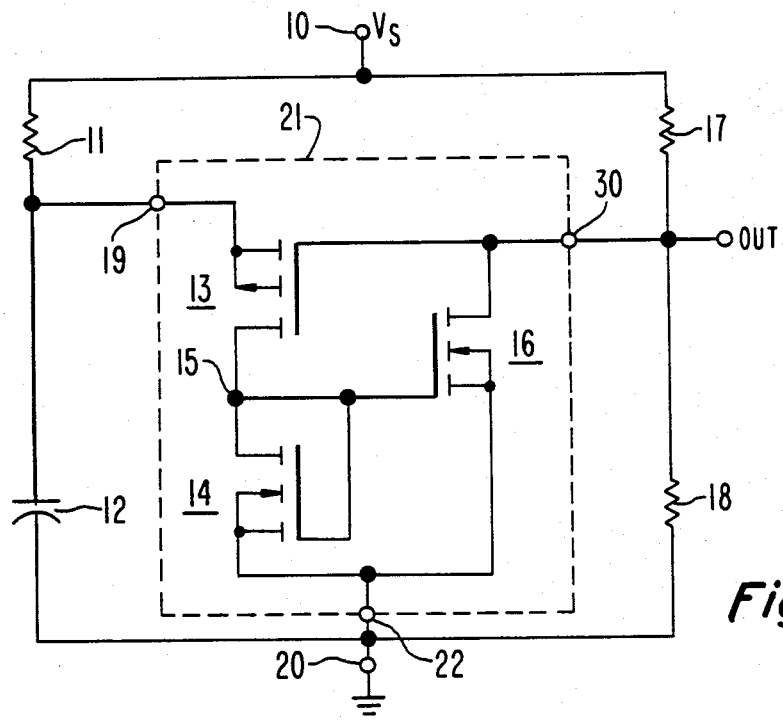
FIG. 1 is a relaxation-type oscillator circuit including an FET negative resistance circuit embodying the present invention.

FIG. 1 is a classical relaxation-oscillator circuit of the type normally employing a programmable unijunction transistor for its active circuit element but having an FET circuit 21 substituted therefore. The FET circuit 21 has first (anode) and second (cathode) terminals 19 and 22 respectively, defining the ends of a circuit path which exhibits a negative resistance type conduction characteristic. Circuit 21 has a third or control terminal 30 for establishing the peak potential normally associated with a negative resistance characteristic.

The oscillator circuit has terminals 10 and 20 for applying relatively positive and relatively negative supply potentials respectively. Resistors 17 and 18, serially connected between terminals 10 and 20, form a potential divider for applying a reference potential $V_{ref}$ to the control terminal 30. The reference potential $V_{ref}$ is equal to $V_s R18/(R17+R18)$ where $V_s$ is the supply potential and R17,R18 are the resistance values of resistor 17 and 18 respectively.

A timing resistor 11 is serially connected to a timing capacitor 12 between the supply terminals 10 and 20. The interconnection of the timing elements is connected to terminal 19 of the FET circuit 21. Finally, the second terminal 22 of the FET circuit 21 is connected to supply terminal 20 which, in the present case, is at ground potential.

Operation of the oscillator proceeds as follows. Let it be assumed that the timing capacitor 12 is initially uncharged and that the FET circuit 21 is in a blocked or nonconductive state because its anode 19 potential is negative with respect to its control electrode 30. The timing capacitor 12 will charge exponentially toward the supply potential through the timing resistor 11. When the potential across the capacitor 12, applied to the anode 19 exceeds the reference potential applied to the control terminal 30 by an amount characteristic of circuit 21, both the anode 19 and the control 30 terminals begin to sink current. Conduction by the control terminal tends to lower the reference potential having the effect of causing greater conduction at the anode 19 (to discharge the timing capacitor) despite the fact that conduction of the anode 19 is lowering the driving potential across the capacitor 12. In turn, the increased conduction at the anode 19 tends to increase conduction at the control terminal 30 until the currents at both terminals reach a saturation level. At this point the regenerative action can no longer be sustained, conduction at the control terminal diminishes, and the reference potential rises to reestablish the blocking state of the circuit 21. Thereafter the timing capacitor 12 enters its recharging mode to initiate another cycle.

The current conducting capability of the anode 19 circuit of circuit 21 is substantially greater than that of resistor 11. Thus the capacitor charges much more slowly than it discharges producing a sawtooth type potential waveform at terminal 19. The regenerative action of circuit 21 drives it into saturation relatively fast so that relatively narrow negative going pulses are produced at the control electrode 30.

Operation of the FET circuit 21 will now be described with more particularity. The circuit includes a P-type MOS transistor 13 with its source electrode connected to terminal 19, its gate electrode connected to terminal 30 and its drain electrode connected at node 15. Transistor 13 will normally conduct current from its source-to-drain electrodes when the potential at its source electrode exceeds the potential at its gate electrode by the threshold or turn on potential of the transistor, i.e., for an enhancement mode transistor. A first N-type MOS transistor 14 is arranged in a diode configuration with its drain and gate electrodes connected to node 15 and its source electrode connected to terminal 22. Transistor 14 will normally conduct current from its drain to its source electrodes when the potential at node 15 exceeds the potential at terminal 22 by the threshold potential of transistor 14 (for an enhancement mode device). A second N-type MOS transistor 16 having similar threshold characteristics to transistor 14 has its drain, gate and source electrodes connected to terminal 30, node 15 and terminal 22, respectively. Transistor 16 will conduct current from terminal 30 to terminal 22 when its gate potential exceeds its source potential by its threshold potential. Transistors 14 and 16, having their gate electrodes coupled together and their source electrodes coupled together, operate as master and slave transistors of a current mirror amplifier with an input terminal at node 15 and an output terminal at terminal 30. Transistor 16 conducts current proportional to the current conducted by transitor 14, the proportionality factor being related to the geometry of the two transistors.

Assume that the reference potential generated by resistors 17 and 18 is ½ the supply potential, e.g. $V_s/2$. Assume also that capacitor 12 has been discharged and therefore the potential at terminal 19 is near ground potential. The source electrode of transistor 13 is therefore more negative than its gate electrode and transistor 13 is not conducting. Capacitor 12 charges through resistor 11 until the potential at terminal 19 reaches $V_{ref}+V_{TH13}$, at which point transistor 13 begins conducting drain current ($V_{TH13}$ is the threshold potential of transistor 13). The drain current of transistor 13 charges node 15 turning on transistor 14 sufficiently to conduct such current. The current conducted by transistor 14 is mirrored in transistor 16, effectively lowering the resistance between terminal 30 and terminal 20, thereby reducing the reference potential applied to control terminal 30. The lowered potential on the gate electrode of transistor 13 causes transistor 13 to conduct more heavily, which in turn causes transistor 14 and thereby transistor 16 to conduct more heavily further reducing the reference potential applied to the transistor 13 gate potential. The current into terminal 19 will increase until limited by the reference potential becoming a relatively constant potential by being pulled near ground. As the transistor 13 drain current discharges capacitor 12, the potential at terminal 19 is lowered decreasing the gate-source potential of transistor 13, the decrease in gate-source potential reducing the drain current. This in turn reduces the drain current in transistor 16 causing the reference potential at terminal 30 to rise further, and, this reduces the drain current in transistor 13, eventually cutting it off. Once transistor 13 is cut off, node 15 will discharge through transistor 14, essentially to ground potential, turning transistor 16 off. The circuit 21 will then be in its initial state and the cycle will start again.

Figure 2:
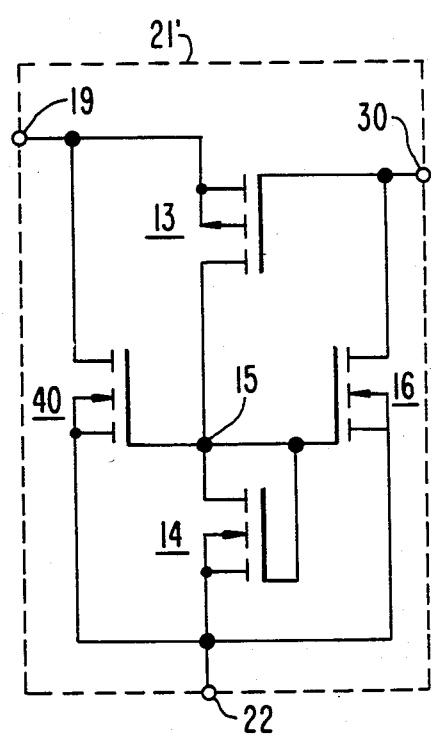
FIGS. 2 and 3 are schematic diagrams of further MOS circuits which exhibit negative resistance conduction characteristics.
Figure 3:
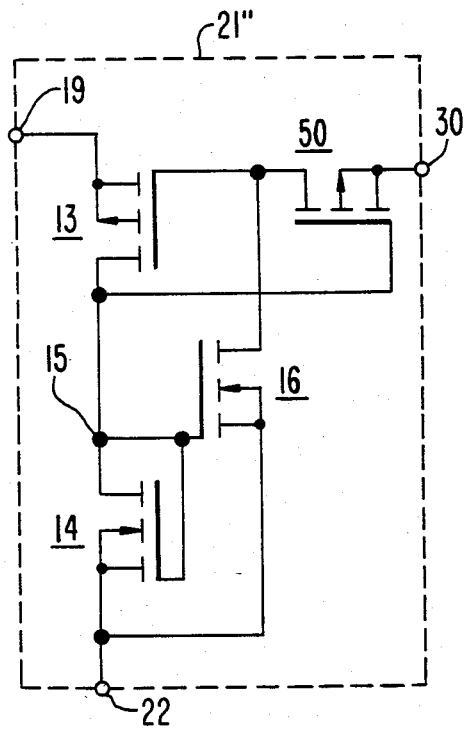

FIGS. 2 and 3 are variations on the FET circuitry 21 described in relation to FIG. 1. In FIGS. 2 and 3, like numerals designate elements corresponding to FIG. 1 circuit elements.

In FIG. 2, the circuitry 21' operates similar to the circuitry 21 in FIG. 1 but having enhanced current sinking capability at terminal 19. In circuit 21' a third N-type MOS transistor 40 has a drain electrode connected to terminal 19, a gate electrode connected to node 15 and a source electrode connected to terminal 22. Transistor 40, having its gate and source electrodes direct coupled to the gate and source electrodes of transistor 14, is slaved thereto and provides a second mirror output at its drain electrode. Transistor 40 conducts current from terminals 19 to 22 in direct proportion to the current conducted in transistor 14 providing an additional current sinking path to discharge terminal 19.

The FIG. 3 circuit 21" is a further FET negative resistance circuit having provision for faster transition between operating stages. In FIG. 3 a second P-type transistor 50 has its drain-source channel serially connected between the transistor 13-gate electrode-transistor 16 drain electrode interconnection and control terminal 30. The source electrode of transistor 50 is connected directly to terminal 30. The gate electrode of transistor 50 is connected to node 15. Note when circuit 21" is in the blocked state, node 15 is substantially at ground potential and terminal 30 is at the relatively high reference potential. P-type transistor 50 is therefore biased on and supplies reference potential to the gate electrode of transistor 13. When the potential at terminal 19 reaches an amplitude of $V_{ref}+V_{TH13}$ transistors 13, 14 and 16 will commence conduction as aforedescribed. However, transistor 50 presents a series impedance between the source of reference potential and the gate electrode of transistor 13. This series impedance enables transistor 16 to pull down the gate potential of transistor 13 more rapidly, i.e., it increases the regenerative gain of the circuit speeding the transition from "blocking" mode to conduction mode. The more drain current conducted by transistor 13, the more positive node 15 becomes tending to turn off transistor 50 and further increasing its series impedance. The greater the series impedance the lower the potential transistor 16 can establish on the gate electrode of transistor 13 further enhancing its conduction parameters.

On the other hand, the imposition of the transistor 50 impedance between the reference source applied to terminal 30 and shunting transistor 16, tends to preclude the reference potential at terminal 30 from being pulled as low as in the absence of transistor 50. Therefore when the potential at node 15 begins to drop due to the discharge of node 19, transistor 50 resumes greater conduction applying a larger reference potential to the gate electrode of transistor 13 more quickly (than in the FIGS. 1 or 2 circuits) and effecting a more rapid transition of the circuitry 21" to the blocking mode.

The present FET circuitry has several advantages over a bipolar-type programmable unijunction transistor. First, since FET's do not exhibit the storage time effects characteristic of saturated bipolar transistors in PUT arrangement, the recovery time of the FET circuit is considerably faster and dissipates less power during the on to off transition. Secondly, substantially no current is required to be provided from the reference source to turn on the series transistor (e.g., 13), a high resistance gate reference network is practical in connection with the FET circuit providing a further reduction in dissipated power. Thirdly, while the threshold voltage of a bipolar device is substantially fixed (i.e., at 1 $V_{BE}=0.5$ to 0.7 volts) the threshold potential of FET's can be tailored during device manufacture over a range of tenths of a volt to volts. And lastly the described circuits provide a means of effectively realizing the function of a PUT integrable on an all FET integrated circuit.

What is claimed is:

1. The combination comprising:
   first and second power terminals for the application therebetween of an operating potential;
   first, second, and third field effect transistors (FETs), each FET having source and drain electrodes defining the ends of a conduction path and a gate electrode for controlling the conductivity of its conduction path;
   said first FET being of first conductivity type and said second and third FETs being of opposite conductivity type;
   first and second input/output (I/O) terminals;
   means connecting the source electrode of said first FET to said first I/O terminal;
   means connecting the drain electrode of said third FET and the gate electrode of said first FET to said second I/O terminal;
   means connecting the source electrodes of said second and third FETs to said second power terminal;
   means connecting the drain electrode of said first FET to the drain and gate of said second FET and to the gate of said third FET for turned-on said second and third FETs when said first FET is turned-on and causing negative resistance characteristics to be exhibited between respective ones of said first and second I/O terminals and said second power terminal;
   input signal means connected to said first I/O terminal for turning-on said first FET when the potential at said first I/O terminal exceeds a given control potential at said second I/O terminal and said first and second FETs when turned-on exhibiting a negative resistance characteristic between said first I/O terminal and said second power terminal for driving the voltage at said first I/O terminal towards the voltage at said second power terminal; and
   a load network connected between said first and second power terminals having an intermediate node connected to said second I/O terminal, said load network for establishing said given control potential at said second I/O terminal when said third transistor is non-conducting, and for enabling the voltage at said second I/O terminal to be driven to the voltage at said second power terminal when said third FET is turned-on, and for then generating a voltage signal at the gate of said first FET increasing the conduction of said first FET.

2. The combination as claimed in claim 1 wherein said input signal means includes a resistive element connected between said first I/O terminal and one of said first and second power terminals and a capacitive element connected between said first I/O terminal and the other one of said first and second power terminals; and
   wherein said load network includes first and second resistive elements forming a voltage divider network, said first and second resistive elements being connected in series between said first and second power terminals and at their junction to said second I/O terminal.

3. A circuit exhibiting negative resistance characteristics comprising:
   first and second terminals between which said negative resistance characteristics are exhibited and a control terminal;
   a first field effect transistor (FET) of a first conductivity type having source and gate electrodes connected respectively to said first terminal and a first node and having a drain electrode;
   an FET current mirror having an input, output and common terminals respectively connected to the drain electrode of said first field effect transistor, said first node, and said second terminal;
   means connecting said first node to the control terminal and a further FET of complementary type to said first transistor, said further FET having drain, gate and source electrodes respectively connected to the first terminal, the drain electrode of said first transistor and said second terminal.

4. The circuit set forth in claim 3 wherein the means connecting the first node to the control terminal comprises a still further FET of like conductivity type as said first FET and having drain, source and gate electrodes, respectively, connected to said first node, said control terminal and the drain electrode of said first transistor.

5. The circuit set forth in claim 3 wherein the FET current mirror comprises:
   second and third field effect transistors of opposite conductivity type to said first field effect transistor having respective gate, drain and source electrodes;
   respective means connecting the gate and drain electrodes of said second transistor to said current mirror input terminal;
   means connecting the gate electrode of said third transistor to said current mirror input terminal;
   means connecting the drain electrode of said third transistor to said current mirror output terminal; and
   respective means connecting the respective source electrodes of the second and third transistors to said current mirror common terminal.

6. The circuit set forth in claim 3 further comprising:
   a timing capacitor having a first electrode connected to said first terminal and a second electrode connected to a point of fixed potential;
   means for providing charging current to the first electrode of said timing capacitor; and
   means for applying a reference potential to said control terminal.

7. A circuit exhibiting negative resistance characteristics comprising:
   first and second terminals between which said negative resistance characteristics are exhibited and a control terminal;
   a first field effect transistor (FET) of a first conductivity type having source and gate electrodes connected respectively to said first terminal and a first node and having a drain electrode;

an FET current mirror having an input, output and common terminals respectively connected to the drain electrode of said first field effect transistor, said first node, and said second terminal;

means connecting said first node to the control terminal; and a further FET of like conductivity type as said first FET and having drain, source and gate electrodes, respectively, connected to said first node, said control terminal and the drain electrode of said first transistor.

8. The circuit set forth in claim 7 wherein said FET current mirror has a further output terminal, said further output terminal being connected to said first terminal.

9. The circuitry set forth in claim 7 further comprising:

a timing capacitor having a first electrode connected to said first terminal and a second electrode connected to a point of fixed potential;

means for providing charging current to the first electrode of said timing capacitor; and means for applying a reference potential to said control terminal.

10. Circuitry which conducts at a predetermined potential comprising:

first and second input terminals for conducting current therebetween when a potential equal to said predetermined potential is applied to said first input terminal;

a control terminal for receiving a reference potential to establish said predetermined potential;

a first field effect transistor (FET) of a first conductivity type having gate and source electrodes connected respectively to said control and said first input terminals, and having a drain electrode;

second and third field effect transistors (FETs) of a conductivity type complementary to said first conductivity type, having respective drain, gate, and source electrodes;

respective means for coupling the source electrodes of the second and third FETs to said second input terminal;

means for connecting the drain electrode of the third FET to said control terminal;

means for interconnecting the drain electrodes of said first and second transistors;

respective means for connecting the gate electrodes of the second and third transistors to the drain electrode of said first transistor; and load means coupled to said control terminal responsive to the turn-on of said first and third FETs for generating a signal voltage at said control terminal having a polarity and amplitude to enhance the conduction of said first FET.

* * * * *

UNITED STATES PATENT AND TRADEMARK OFFICE
CERTIFICATE OF CORRECTION

PATENT NO. : 4,491,807
DATED : Jan. 1, 1985
INVENTOR(S) : Merle V. Hoover

It is certified that error appears in the above-identified patent and that said Letters Patent is hereby corrected as shown below:

Col. 5, line 38, change "turned-on" to - - - turning-on - - -.

Signed and Sealed this

Eighteenth Day of June 1985

[SEAL]

Attest:

DONALD J. QUIGG

Attesting Officer

Acting Commissioner of Patents and Trademarks